(12) United States Patent
Kirihara et al.

(10) Patent No.: US 9,859,486 B2
(45) Date of Patent: Jan. 2, 2018

(54) THERMOELECTRIC CONVERSION ELEMENT AND MANUFACTURING METHOD FOR SAME

(71) Applicant: NEC Corporation, Tokyo (JP)

(72) Inventors: Akihiro Kirihara, Tokyo (JP); Masahiko Ishida, Tokyo (JP); Shigeru Koumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/414,969

(22) PCT Filed: Apr. 15, 2013

(86) PCT No.: PCT/JP2013/061223
§ 371 (c)(1),
(2) Date: Jan. 15, 2015

(87) PCT Pub. No.: WO2014/013766
PCT Pub. Date: Jan. 23, 2014

(65) Prior Publication Data
US 2015/0194587 A1    Jul. 9, 2015

(30) Foreign Application Priority Data

Jul. 19, 2012 (JP) .................. 2012-160242

(51) Int. Cl.
*H01L 35/28* (2006.01)
*H01L 35/30* (2006.01)
(Continued)

(52) U.S. Cl.
CPC .............. *H01L 37/00* (2013.01); *H01L 35/00* (2013.01); *H01L 35/04* (2013.01); *H01L 35/34* (2013.01);
(Continued)

(58) Field of Classification Search
CPC ......... H01L 35/00; H01L 37/00; H01L 43/04; H01L 43/06; H01L 43/065
(Continued)

(56) References Cited

U.S. PATENT DOCUMENTS 4,465,894 A * 8/1984 Reyes ............... H01L 35/32
136/201
2010/0276770 A1* 11/2010 Uchida ............... G01K 7/36
257/421
2011/0084349 A1    4/2011 Uchida et al.

FOREIGN PATENT DOCUMENTS

CN    101894905 A    11/2010
JP    2009-130070    6/2009
(Continued)

OTHER PUBLICATIONS

K. Uchida et al., "Spin Seebeck insulator", Nature Materials, vol. 9, pp. 894-897, Nov. 2010.
(Continued)

*Primary Examiner* — Lindsey Bernier
(74) *Attorney, Agent, or Firm* — Finnegan, Henderson, Farabow, Garrett & Dunner, L.L.P.

(57) ABSTRACT

A thermoelectric conversion element includes a thermoelectric conversion sheet possessing flexibility. The thermoelectric conversion sheet includes a magnetic layer, an electricity-generating layer that is formed on the magnetic layer so as to contact with the magnetic layer and that is formed of a material exhibiting spin orbit coupling, and a first electrode and a second electrode formed on the electricity-generating layer so as to contact with the electricity-generating layer. The first electrode and the second electrode extend in a longitudinal direction of the thermoelectric conversion sheet, and are separated from each other in a first direction perpendicular to the longitudinal direction.

16 Claims, 7 Drawing Sheets

(51) Int. Cl.
H01L 35/12 (2006.01)
H01L 37/00 (2006.01)
H01L 35/00 (2006.01)
H01L 43/06 (2006.01)
H01L 35/04 (2006.01)
H01L 35/34 (2006.01)
H01L 43/04 (2006.01)
H01L 43/14 (2006.01)

(52) U.S. Cl.
CPC .............. *H01L 43/04* (2013.01); *H01L 43/06* (2013.01); *H01L 43/065* (2013.01); *H01L 43/14* (2013.01)

(58) Field of Classification Search
USPC ...................................... 136/203, 205, 236.1
See application file for complete search history.

(56) References Cited

FOREIGN PATENT DOCUMENTS

| JP | 2011-249746 | 12/2011 |
| JP | 2012-109367 | 6/2012 |
| WO | WO 2009/151000 A1 | 12/2009 |
| WO | WO 2011/118374 A1 | 9/2011 |
| WO | WO 2012-108276 A1 | 8/2012 |
| WO | WO 2012/169377 A1 | 12/2012 |
| WO | WO 2013/046948 A1 | 4/2013 |

OTHER PUBLICATIONS

K. Uchida et al., "Observation of longitudinal spin-Seebeck effect in magnetic insulators", Applied Physics Letters, vol. 97, pp. 172505-1-172505-3, 2010.

International Search Report and Written Opinion dated Jul. 9, 2013 in PCT/JP2013/061223.

Office Action dated Aug. 3, 2016, by the Chinese Patent Office in counterpart Chinese Patent Application No. 201380038546.X.

Japanese Office Action dated Feb. 7, 2017, by the Japanese Patent Office in counterpart Japanese Patent Application No. 2014-525736.

Decision to Grant a Patent dated May 23, 2017, by the Japanese Patent Office in Counterpart Japanese Patent Application No. 2014-525736.

* cited by examiner

HEAT SOURCE

THERMOELECTRIC CONVERSION ELEMENT AND MANUFACTURING METHOD FOR SAME

CROSS-REFERENCE TO RELATED PATENT APPLICATIONS

This application is a National Stage Entry of International Application No. PCT/JP2013/061223, filed Apr. 15, 2013, which claims priority from Japanese Patent Application No. 2012-160242, filed Jul. 19, 2012. The entire contents of the above-referenced applications are expressly incorporated herein by reference.

TECHNICAL FIELD

The present invention relates to a thermoelectric conversion element based on the spin-Seebeck effect and the inverse spin-Hall effect, and a manufacturing method for the same.

BACKGROUND ART

Recently, an electronic technique called as "spintronics" has been brought into the spotlight. While the conventional electronics uses only "electric charge" that is one property of an electron, the spintronics positively uses "spin" that is another property of an electron in addition to that. Particularly, "spin-current" that is flow of spin angular momentum of electronics is an important concept. Since energy dissipation of spin-current is small, there is a possibility that using spin-current can accomplish highly efficient information transfer. Accordingly, generation, detection, and control of spin-current is an important theme.

For example, there is known a phenomenon that when an electric current flows, spin-current is generated. This is called as "spin-Hall effect". As a phenomenon opposite thereto, it is known that when spin-current occurs, electromotive force is generated. This is called as "inverse spin-Hall effect". By using the inverse spin-Hall effect, spin-current can be detected. The spin-Hall effect and the inverse spin-Hall effect are significantly exhibited in a material (e.g., Pt or Au) whose "spin orbit coupling" is strong.

By recent research, existence of "spin-Seebeck effect" in a magnetic material has been made clear. The spin-Seebeck effect is a phenomenon that when temperature gradient is applied to a magnetic material, spin-current is induced in a direction parallel with the temperature gradient (e.g., refer to Patent Literature 1, Non-patent Literature 1, and Non-patent Literature 2). In other words, by the spin-Seebeck effect, heat is converted into spin-current (heat spin-current conversion). Patent Literature 1 reports the spin-Seebeck effect in a NiFe film that is a ferromagnetic metal. Non-patent Literatures 1 and 2 report the spin-Seebeck effect at an interface between a metal film and a magnetic insulator such as yttrium iron garnet (YIG, $Y_3Fe_5O_{12}$).

Spin-current induced by temperature gradient can be converted into an electric field (electric current, voltage) by using the above-mentioned inverse spin-Hall effect. Namely, using both of the spin-Seebeck effect and the inverse spin-Hall effect enables "thermoelectric conversion" that converts temperature gradient into electricity.

FIG. 1 illustrates a configuration of a thermoelectric conversion element disclosed in Patent Literature 1. On a sapphire substrate 101, a heat spin-current conversion unit 102 is formed. The heat spin-current conversion unit 102 has a laminated structure of a Ta film 103, a PdPtMn film 104, and a NiFe film 105. The NiFe film 105 has magnetization in an in-plane direction. On the NiFe film 105, a Pt electrode 106 is formed. Both ends of the Pt electrode 106 are connected to terminals 107-1 and 107-2, respectively.

In the thus-configured thermoelectric conversion element, the NiFe film 105 plays a role of generating spin-current from temperature gradient by the spin-Seebeck effect, and the Pt electrode 106 plays a role of generating electromotive force from the spin-current by the inverse spin-Hall effect. Concretely, when temperature gradient is applied in the in-plane direction of the NiFe film 105, the spin-current is generated in a direction parallel with the temperature gradient by the spin-Seebeck effect. Then, the spin-current flows from the NiFe film 105 into the Pt electrode 106. Alternatively, the spin-current flows out of the Pt electrode 106 to the NiFe film 105. In the Pt electrode 106, by the inverse spin-Hall effect, the electromotive force is generated in a direction perpendicular to the spin-current direction and the NiFe magnetization direction. The electromotive force can be brought out from the terminals 107-1 and 107-2 provided at the both ends of the Pt electrode 106.

CITATION LIST

Patent Literature

[PTL1] Japanese Laid-open Patent Publication No. 2009-130070

Non Patent Literature

[NPL1] Uchida et al., "Spin Seebeck insulator", Nature Materials, 2010, vol. 9, p. 894.
[NPL2] Uchida et al., "Observation of longitudinal spin-Seebeck effect in magnetic insulators", Applied Physics Letters, 2010, vol. 97, p 172505.

SUMMARY OF INVENTION

It is desired to make output of a thermoelectric conversion element higher.

In one aspect of the present invention, a thermoelectric conversion element is provided. The thermoelectric conversion element includes a thermoelectric conversion sheet possessing flexibility. The thermoelectric conversion sheet includes: a magnetic layer; an electricity-generating layer that is formed on the magnetic layer so as to contact with the magnetic layer, and that is formed of a material exhibiting spin orbit coupling; and a first electrode and a second electrode formed on the electricity-generating layer so as to contact with the electricity-generating layer. The first electrode and the second electrode extend in a longitudinal direction of the thermoelectric conversion sheet, and are separated from each other in a first direction perpendicular to the longitudinal direction.

In another aspect of the present invention, a manufacturing method for a thermoelectric conversion element is provided. The manufacturing method includes (A) a step of providing a thermoelectric conversion sheet possessing flexibility. The thermoelectric conversion sheet includes: a magnetic layer; an electricity-generating layer that is formed on the magnetic layer so as to contact with the magnetic layer, and that is formed of a material exhibiting spin orbit coupling; and a first electrode and a second electrode formed on the electricity-generating layer so as to contact with the electricity-generating layer. The first electrode and the second electrode extend in a longitudinal direction of the thermoelectric conversion sheet, and are separated from each other in a first direction perpendicular to the longitudinal direction. The manufacturing method further includes (B) a step of winding the thermoelectric conversion sheet around a center axis parallel with the first direction.

According to the present invention, higher output of the thermoelectric conversion element can be accomplished.

DESCRIPTION OF EMBODIMENTS

Embodiments of the present invention are described with reference to the accompanying drawings.

1. Configuration

Figure 1:
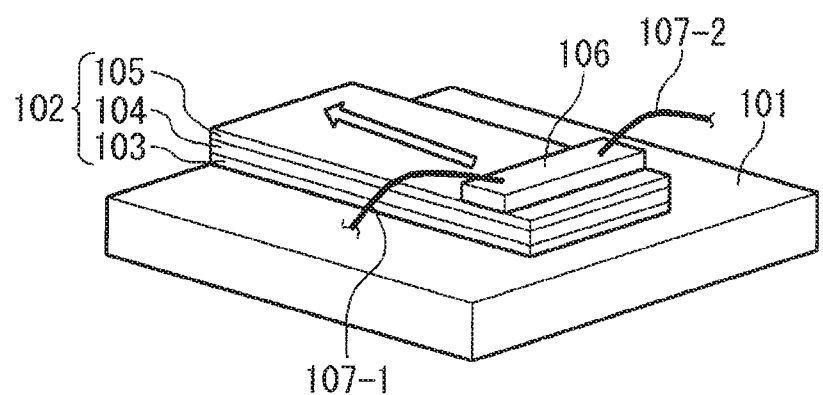
FIG. 1 is a schematic view illustrating a thermoelectric conversion element described in Patent Literature 1.
Figure 2:
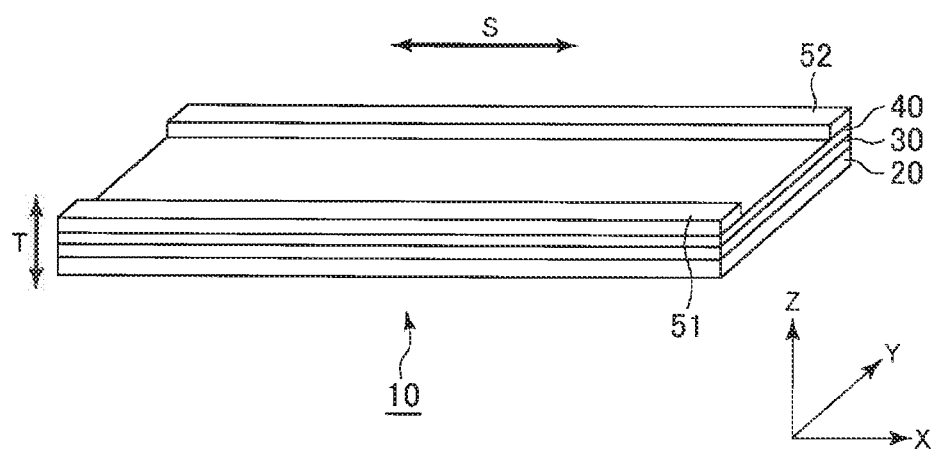
FIG. 2 is a schematic view illustrating a thermoelectric conversion element according to an embodiment of the present invention.
Figure 3:
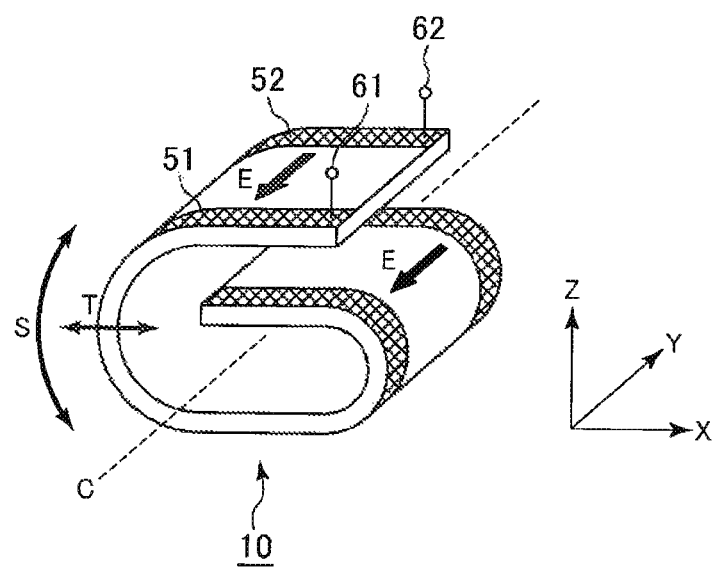
FIG. 3 is a schematic view illustrating the thermoelectric conversion element according to the embodiment of the present invention.

FIG. 2 and FIG. 3 schematically illustrate a thermoelectric conversion element according to a first embodiment of the present invention. The thermoelectric conversion element includes a thermoelectric conversion sheet 10. The thermoelectric conversion sheet 10 has flexibility. The flexibility includes concepts of both plasticity and elasticity. In other words, the thermoelectric conversion sheet 10 can be bent (refer to FIG. 3).

As illustrated in FIG. 2 and FIG. 3, the thermoelectric conversion sheet 10 has a shape that is long in one direction. The longitudinal direction (extending direction) of the thermoelectric conversion sheet 10 is represented by "S" in the drawings. Since the thermoelectric conversion sheet 10 can be bent, the longitudinal direction (S direction) can be locally defined at each point of the thermoelectric conversion sheet 10 (refer to FIG. 3).

The thermoelectric conversion sheet 10 includes a substrate 20, a magnetic layer 30, an electricity-generating layer 40, a first electrode 51, and a second electrode 52. The magnetic layer 30 is formed on the substrate 20. The electricity-generating layer 40 is formed on the magnetic layer 30 so as to contact with the magnetic layer 30. Namely, the substrate 20, the magnetic layer 30, and the electricity-generating layer 40 are laminated in this order. This laminating direction is perpendicular to the above-described longitudinal direction (S direction), and is represented by "T" in the drawings. Since the thermoelectric conversion sheet 10 can be bent, the laminating direction (T direction) can be locally defined at each point of the thermoelectric conversion sheet 10 (refer to FIG. 3).

The magnetic layer 30 is formed by a material exhibiting the spin-Seebeck effect. A material of the magnetic layer 30 may be a ferromagnetic metal, or a magnetic insulator. As the ferromagnetic metal, NiFe, CoFe, CoFeB, and the like can be cited. As the magnetic insulator, yttrium iron garnet (YIG, $Y_3Fe_5O_{12}$), YIG (Bi:YIG) to which bismuth (Bi) has been doped, YIG ($LaY_2Fe_5O_{12}$) to which lanthanum (La) has been doped, yttrium gallium iron garnet ($Y_3Fe_{5-x}Ga_xO_{12}$), and the like are cited. From the standpoint of suppressing thermal conduction due to electrons, it is desirable to use the magnetic insulator.

The electricity-generating layer (electric conduction layer) 40 is formed by a material exhibiting the inverse spin-Hall effect (spin orbit coupling). More specifically, a material of the electricity-generating layer 40 includes a metal material of which spin orbit coupling is strong. For example, Au, Pt, Pd or Ir of which spin orbit coupling is relatively strong, other metal materials having the f-orbit, or alloy materials including them are used. Only by doping a material such as Au, Pt, Pd, or Ir by approximately 0.5 to 10% to a general metal film material such as Cu, the same effect can be obtained. Alternatively, the electricity-generating layer 40 may be an oxide such as ITO.

By lamination of these magnetic layer 30 and electricity-generating layer 40, the thermoelectric conversion sheet 10 comes to possess thermoelectric conversion function that uses the spin-Seebeck effect and the inverse spin-Hall effect. More specifically, the magnetic material 30 generates (drives) spin-current from temperature gradient by the spin-Seebeck effect. The electricity-generating layer 40 generates electromotive force from the spin-current by the inverse spin-Hall effect. The direction of the generated electromotive force is given by an outer product of the magnetization direction of the magnetic layer 30 and the temperature gradient direction.

The first electrode 51 and the second electrode 52 are provided for efficiently bringing out electromotive force generated in the electricity-generating layer 40. More specifically, the first electrode 51 and the second electrode 52 are formed on the electricity-generating layer 40 so as to contact with the electricity-generating layer 40. Both the first electrode 51 and the second electrode 52 extend in the same direction as the longitudinal direction (S direction) of the thermoelectric conversion sheet 10. Further, the first electrode 51 and the second electrode 52 are separated from each other in a "Y direction (first direction)". The Y direction is the direction perpendicular to both of the longitudinal direction (S direction) and the laminating direction (T direction) of the thermoelectric conversion sheet 10.

Sheet resistance of each of the first electrode 51 and the second electrode 52 is preferably lower than sheet resistance of the electricity-generating layer 40. Namely, the first electrode 51 and the second electrode 52 form low resistance regions. The first electrode 51 and the second electrode 52 may be formed of a material different from a material of the electricity-generating layer 40, or may be formed of the same material as a material of the electricity-generating layer 40.

One example of the element configuration is as follows. A length of the thermoelectric conversion sheet 10 in the longitudinal direction is 300 mm, and its width in the Y direction is 30 mm. The electricity-generating layer 40 is a Pt film, its thickness is 10 nm, and its sheet resistance is approximately 50Ω square. In this case, a resistance value of the electricity-generating layer 40 in the Y direction is approximately 5Ω. Meanwhile, each of the first electrode 51 and the second electrode 52 is a Cu film, its thickness is 1 μm, and its width in the Y direction is 3 mm. In this case, an S-direction resistance value of each of the first electrode 51 and the second electrode 52 is approximately 1Ω. Using such first electrode 51 and second electrode 52 enables electromotive force generated in the electricity-generating layer 40 to be efficiently brought out.

2. Use Method

As described above, the thermoelectric conversion sheet 10 according to the present embodiment has flexibility, and can be bent. Actually, the thermoelectric conversion sheet 10 is preferably used in a state where the thermoelectric conversion sheet 10 is bent. More specifically, as illustrated in FIG. 3, the thermoelectric conversion sheet 10 is used in a state where the thermoelectric conversion sheet 10 is wound around a center axis C parallel with the Y direction. The surface on which the first electrode 51 and the second electrode 52 are formed faces outward in an example of FIG. 3, but may face inward.

Furthermore, the thermoelectric conversion sheet 10 is configured such that electromotive force is generated in the Y direction (−Y direction in the example of FIG. 3) in the electricity-generating layer 40. As described above, the direction of electromotive force generated in the electricity-generating layer 40 depends on both of the magnetization direction of the magnetic layer 30 and the temperature gradient direction. Since the temperature gradient direction depends on a use form (such as a position of a heat source), the magnetization direction of the magnetic layer 30 had better be appropriately set in accordance with the use form (as described below). In any case, the thermoelectric conversion sheet 10 can be configured such that electromotive force is generated in the Y direction in the electricity-generating layer 40.

Electromotive force generated in the Y direction in the electricity-generating layer 40 can be brought out through the first electrode 51 and the second electrode 52 separated from each other in the Y direction. At this time, the first electrode 51 has an approximately uniform electric potential. The second electrode 52 has an approximately uniform electric potential, as well. As illustrated in FIG. 3, a first external terminal 61 and a second external terminal 62 may be attached to respective appropriate positions of the first electrode 51 and the second electrode 52. Using these first external terminal 61 and second external terminal 62 enables electric power to be brought out to the outside.

3. Advantageous Effect

According to the present embodiment, the thermoelectric conversion sheet 10 having flexibility is used. Therefore, even when an area of the thermoelectric conversion sheet 10 is increased for making output high, folding the thermoelectric conversion sheet 10 can suppress increase in an area of the entire thermoelectric conversion element. In other words, it becomes possible to increase electric power generation amount, i.e., output electric power without increasing an area of the element.

Furthermore, according to the present embodiment, electromotive force generated in the Y direction in the electricity-generating layer 40 is brought out through the first electrode 51 and the second electrode 52 separated from each other in the Y direction. These first electrode 51 and second electrode 52 extend in the S direction perpendicular to the Y direction. Thereby, an electric-current path between the first electrode 51 and the second electrode 52 becomes the shortest, and resistance loss (ohmic loss) in the electricity-generating layer 40 can be greatly reduced. This aspect, also, contributes to increase in electric power generation amount, i.e., output electric power.

4. Various Examples

4-1. First Example

Figure 4:
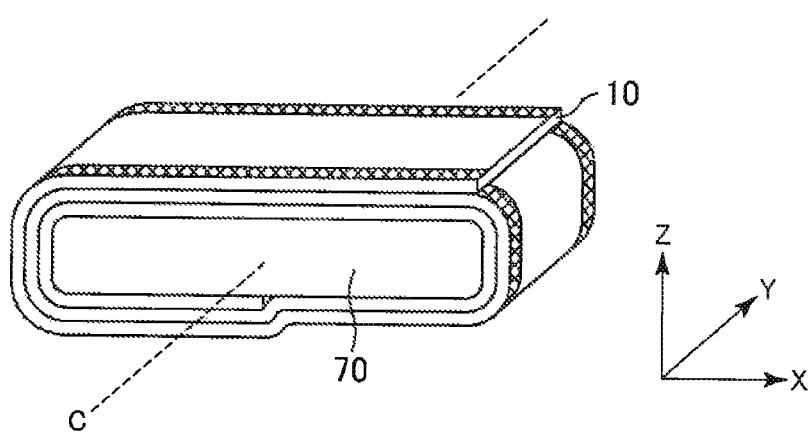
FIG. 4 is a schematic view for describing a usage example of the thermoelectric conversion element according to the embodiment of the present invention.

Description is made about a concrete example of a using method of the thermoelectric conversion sheet 10 (a manufacturing method for the thermoelectric conversion element) according to the present embodiment. First, the thermoelectric conversion sheet 10 illustrated in FIG. 2 is provided. Next, as illustrated in FIG. 4, the thermoelectric conversion sheet 10 is wound around a support body 70 thereon. More specifically, an axial direction (the direction of the center axis C) of the support body 70 is parallel with the Y direction, and the thermoelectric conversion sheet 10 is wound thereon centering the center axis C so as to have a wound shape. In the thermoelectric conversion sheet 10 illustrated in FIG. 4, a part excluding a bent part at a side surface is referred to as "electricity-generating part" in the following.

Figure 5:
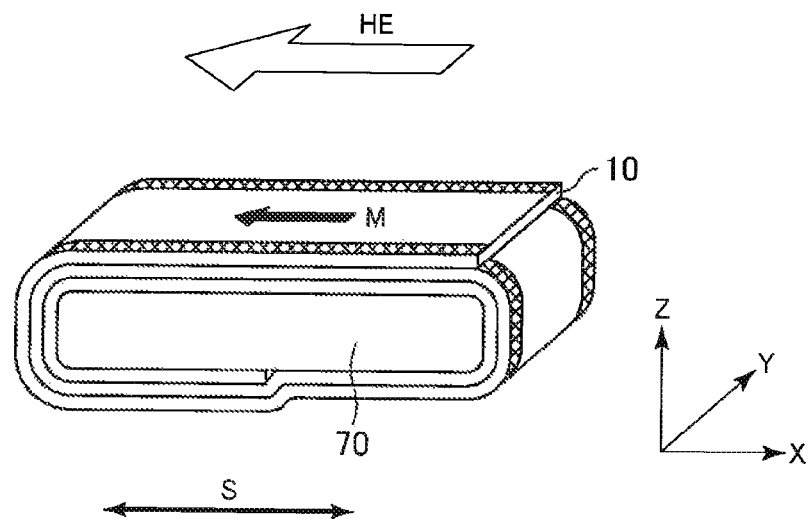
FIG. 5 is a schematic view for describing the usage example of the thermoelectric conversion element according to the embodiment of the present invention.

After the winding on it, as illustrated in FIG. 5, a magnetization-direction initializing process to the magnetic layer 30 is performed. Concretely, an external magnetic field HE in the −X direction is applied to the entire element. As a result, a magnetization direction of the electricity-generating part becomes parallel with the longitudinal direction (S direction) of the thermoelectric conversion sheet 10.

Figure 6:
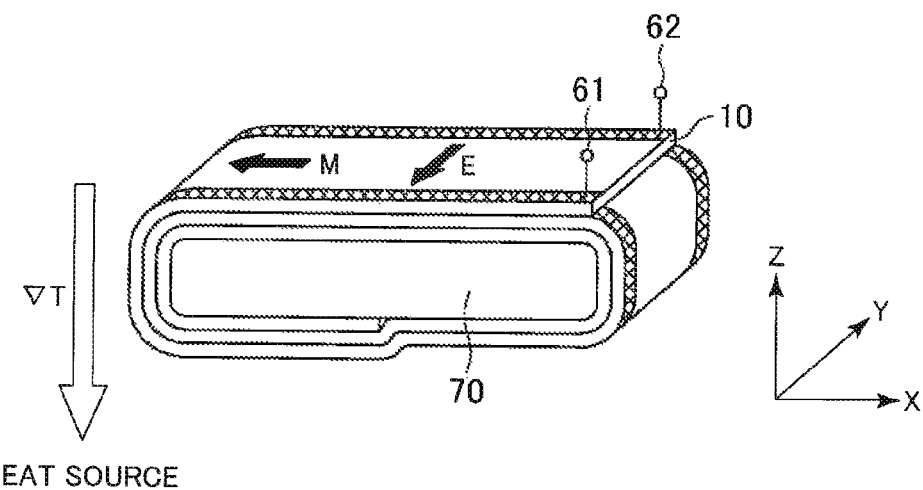
FIG. 6 is a schematic view for describing the usage example of the thermoelectric conversion element according to the embodiment of the present invention.

FIG. 6 illustrates a case where a heat source is positioned in the −Z direction when seen from the thermoelectric conversion element. In this case, the temperature gradient direction is the −Z direction. The direction of the electromotive force in the electricity-generating layer 40 is given by an outer product of the magnetization direction (S direction) of the electricity-generating part and the temperature gradient direction (−Z direction), and in this example, is the −Y direction. The electromotive force is efficiently brought out through the first electrode 51 and the second electrode 52 separated from each other in the Y direction.

The magnetization direction of the magnetic layer 30 (electricity-generating part) is the S direction in this example, but is not limited to this. It suffices that an electric potential difference is generated between the first electrode 51 and the second electrode 52. For this purpose, the magnetization of the magnetic layer 30 has only to include a "component" of the S direction.

4-2. Second Example

Figure 7:
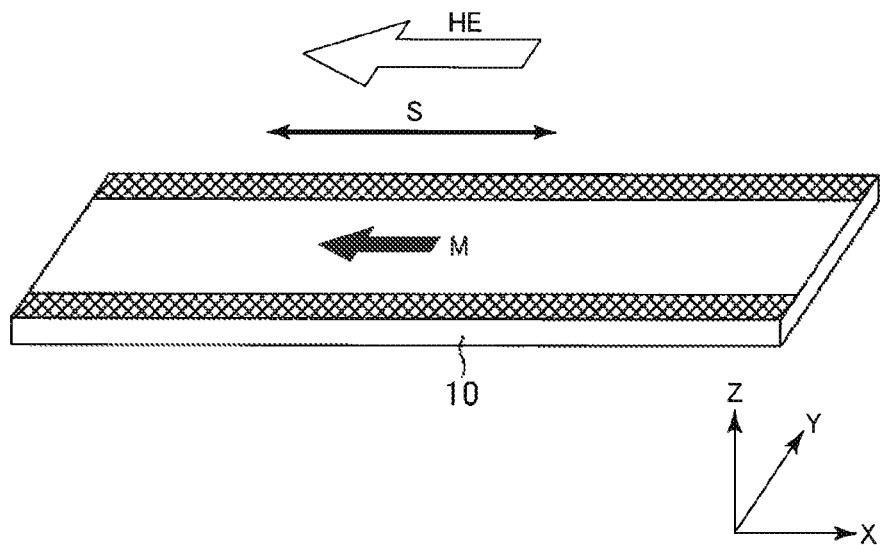
FIG. 7 is a schematic view for describing a usage example of the thermoelectric conversion element according to the embodiment of the present invention.

Description is made about another concrete example of a using method of the thermoelectric conversion sheet 10 (a manufacturing method for the thermoelectric conversion element) according to the present embodiment. First, the thermoelectric conversion sheet 10 illustrated in FIG. 2 is provided. Next, as illustrated in FIG. 7, an external magnetic field HE in the −X direction is applied to the entire element so that a magnetization-direction initializing process is performed. As a result, a magnetization direction of the magnetic layer 30 becomes parallel with the longitudinal direction (S direction) of the thermoelectric conversion sheet 10.

Figure 8:
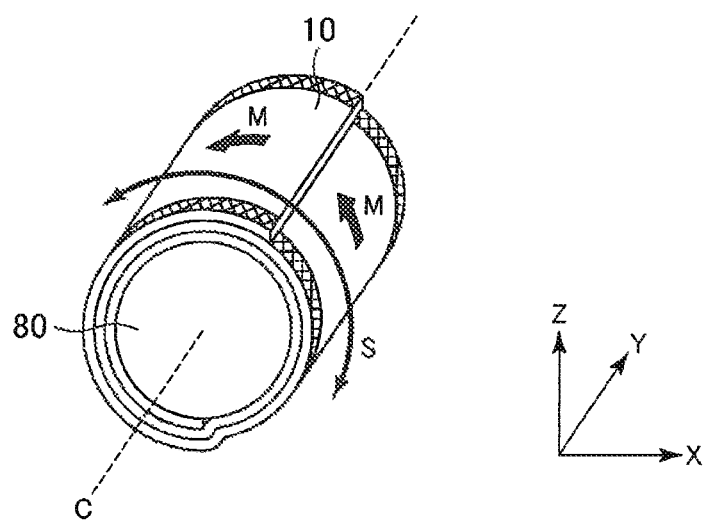
FIG. 8 is a schematic view for describing the usage example of the thermoelectric conversion element according to the embodiment of the present invention.

After the magnetization-direction initializing process, as illustrated in FIG. 8, the thermoelectric conversion sheet 10 is wound around a heat source 80 thereon. More specifically, an axial direction (the direction of the center axis C) of the cylindrical heat source 80 (e.g., a heat exhaust pipe) is parallel with the Y direction, and the thermoelectric conversion sheet 10 is wound thereon centering the center axis C so as to have a wound shape.

Figure 9:
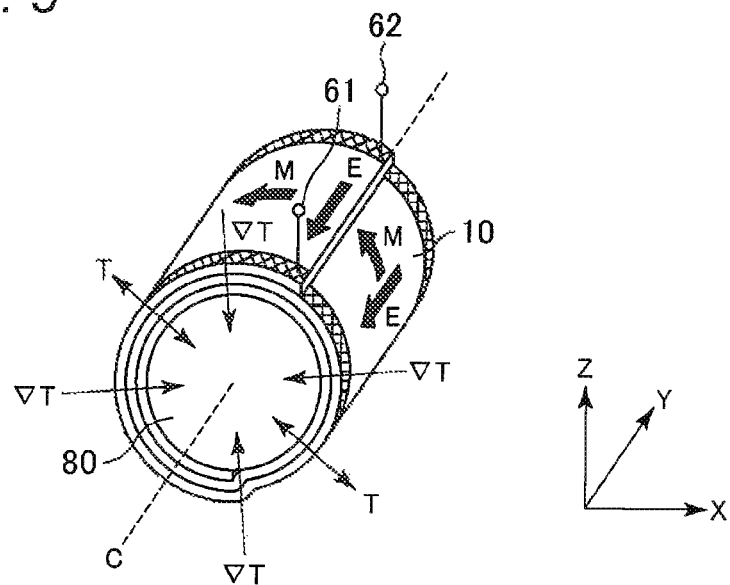
FIG. 9 is a schematic view for describing the usage example of the thermoelectric conversion element according to the embodiment of the present invention.

In this example, as illustrated in FIG. 9, the temperature gradient direction is the laminating direction (T direction) of the thermoelectric conversion sheet 10. The direction of the electromotive force in the electricity-generating layer 40 is given by an outer product of the magnetization direction (S direction) of the magnetic layer 30 and the temperature gradient direction (T direction), and in this example, is the −Y direction. The electromotive force is efficiently brought out through the first electrode 51 and the second electrode 52 separated from each other in the Y direction.

The magnetization direction of the magnetic layer 30 is the S direction in this example, but is not limited to this. It suffices that an electric potential difference is generated between the first electrode 51 and the second electrode 52. For this purpose, the magnetization of the magnetic layer 30 has only to include a "component" of the S direction.

When the magnetization-direction initializing process is performed before the thermoelectric conversion sheet 10 is wound around the heat source 80 thereon as described above, a uniform external magnetic field HE may be applied. Therefore, a simple manufacturing apparatus (an apparatus for the magnetization-direction initializing process) can be used. However, a method of the magnetization-direction initializing process is not limited to this. The magnetization-direction initializing process by methods as illustrated in FIG. 10 and FIG. 11 is also possible.

Figure 10:
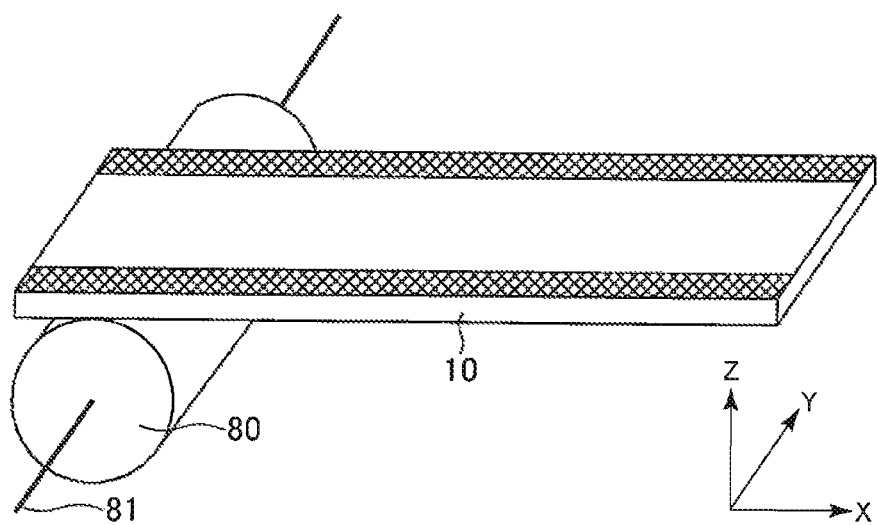
FIG. 10 is a schematic view for describing the usage example of the thermoelectric conversion element according to the embodiment of the present invention.
Figure 11:
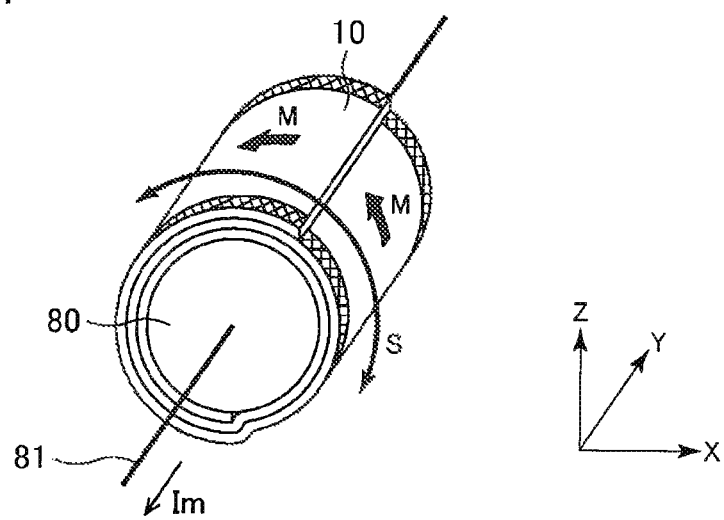
FIG. 11 is a schematic view for describing the usage example of the thermoelectric conversion element according to the embodiment of the present invention.

Concretely, as illustrated in FIG. 10, a magnetization control wire 81 extending along the axis of the heat source 80 is provided. Then, as illustrated in FIG. 11, the thermoelectric conversion sheet 10 is wound around the heat source 80 thereon. After the winding on it, the magnetization-direction initializing process is performed. Specifically, an initializing electric current Im is made to flow through the magnetization control wire 81. As a result, a magnetic field in the S direction is generated around the magnetization control wire 81. Thereby, the magnetization direction of the magnetic layer 30 is initialized in the S direction. In the case of this method, since the magnetization-direction initializing process is performed after the thermoelectric conversion sheet 10 having a large area is wound on it, there is an advantage that a manufacturing apparatus (an apparatus for the magnetization-direction initializing process) can be made compact.

4-3. Third Example

If a space remains between the first electrode 51 and the second electrode 52 when the thermoelectric conversion sheet 10 is wound, thermal conduction slows down in the space, and electricity-generating efficiency is reduced. For this reason, the thermoelectric conversion sheet 10 may be formed such that a space does not remain between the first electrode 51 and the second electrode 52.

Figure 12:
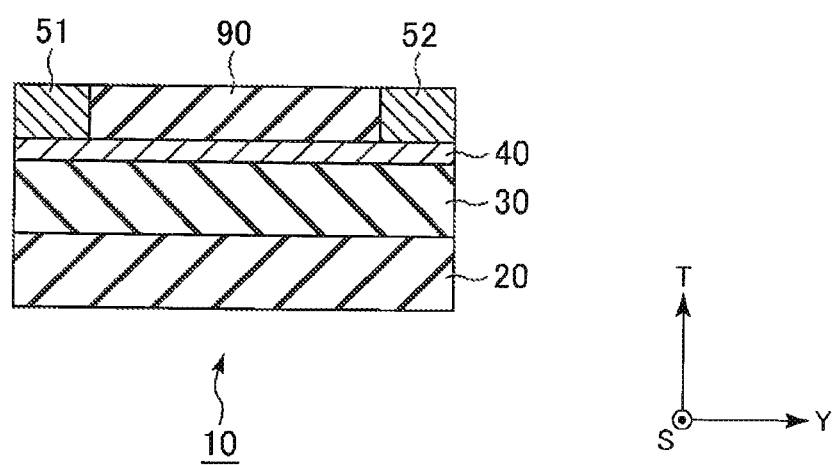
FIG. 12 is a sectional view illustrating a modified example of the thermoelectric conversion element according to the embodiment of the present invention.

FIG. 12 illustrates one example, and more specifically illustrates a YT section of the thermoelectric conversion sheet 10. As illustrated in FIG. 12, on the electricity-generating layer 40, an insulator 90 may be formed. More specifically, the insulator 90 is formed so as to cover an exposed surface of the electricity-generating layer 40, and to occupy a space between the first electrode 51 and the second electrode 52. The insulator 90 is formed of a material having high thermal conductivity (low thermal resistance), e.g., polyimide.

By such an insulator 90, when the thermoelectric conversion sheet 10 is wound, a space is prevented from being generated, and electricity-generating efficiency is improved.

4-4. Fourth Example

A formation pattern of the electricity-generating layer 40 is not limited to the above-described examples. As long as an electric potential difference is generated between the first electrode 51 and the second electrode 52, any formation pattern of the electricity-generating layer 40 is possible.

Figure 13:
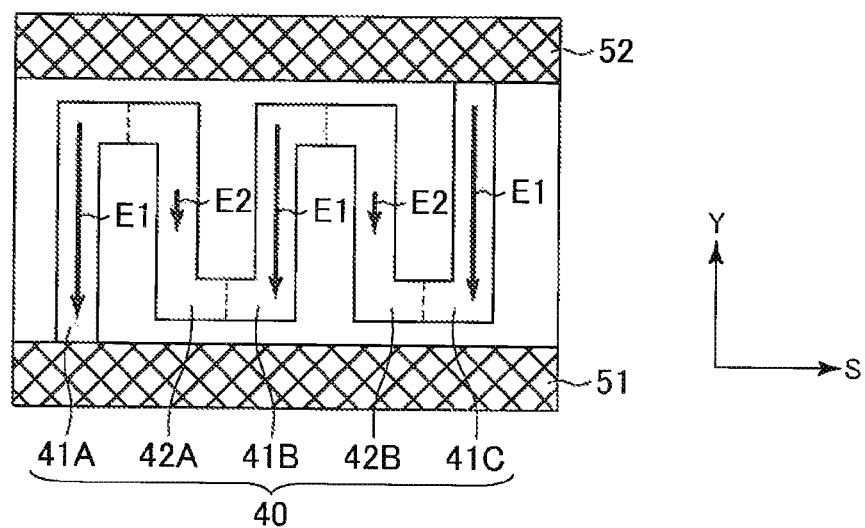
FIG. 13 is a plan view illustrating another modified example of the thermoelectric conversion element according to the embodiment of the present invention.

FIG. 13 illustrates one example, and illustrates an SY plane pattern of the electricity-generating layer 40. In this example, the electricity-generating layer 40 makes electrical connection between the first electrode 51 and the second electrode 52, and its formation pattern is a "meandering shape". In the electricity-generating layer 40, electromotive force in the −Y direction is generated. However, due to the meandering shape, mutual cancellation of the electromotive force occurs.

In view of it, an electricity-generating efficiency distribution in the electricity-generating layer 40 is preferably adjusted such that the mutual cancellation of the electromotive force is suppressed as much as possible. Concretely, the electricity-generating layer 40 is formed so as to include a high-efficiency electricity-generating part 41 of which electricity-generating efficiency is high, and a low-efficiency electricity-generating part 42 of which electricity-generating efficiency is low. The high-efficiency electricity-generating part 41 and the low-efficiency electricity-generating part 42 are formed of materials having different electricity-generating efficiency, for example.

In the high-efficiency electricity-generating part 41 and the low-efficiency electricity-generating part 42, electromotive force E1 and E2 in the −Y direction is generated respectively. The electromotive force E1 is larger than the electromotive force E2 (E1>E2). Accordingly, the high-efficiency electricity-generating part 41 and the low-efficiency electricity-generating part 42 are arranged alternately so that the mutual cancellation of the electromotive force can be suppressed even in the meandering-shaped electricity-generating layer 40. In the example of FIG. 13, from the first electrode 51 toward the second electrode 52, a high-efficiency electricity-generating part 41A, a low-efficiency electricity-generating part 42A, a high-efficiency electricity-generating part 41B, a low-efficiency electricity-generating part 42B, and a high-efficiency electricity-generating part 41C are arranged alternately. Thereby, also in the meandering-shaped electricity-generating layer 40, the electromotive force that is sufficient as a whole can be obtained.

A pattern as illustrated in FIG. 13 may be repeatedly formed on the thermoelectric conversion sheet 10.

A formation pattern of the electricity-generating layer 40 is not limited to a meandering shape, and may be appropriately designed in accordance with desired characteristics. Appropriately adjusting a formation pattern of the electricity-generating layer 40 can control internal resistance between the first electrode 51 and the second electrode 52 without changing a width (a Y-direction width of the thermoelectric conversion sheet 10) between the first electrode 51 and the second electrode 52. Thereby, it becomes possible to obtain desired characteristics.

In the above, the embodiment of the present invention is described with reference to the accompanying drawings. However, the present invention is not limited to the above-described embodiment, and can be appropriately modified by a person skilled in the art within a range that does not depart from the essence of the invention.

A part or all of the above-described embodiment can be described as in the following supplemental notes, but is not limited to the following.

(Supplemental Note 1)

A thermoelectric conversion element that includes a thermoelectric conversion sheet possessing flexibility,
wherein the thermoelectric conversion sheet includes:
a magnetic layer;
an electricity-generating layer that is formed on the magnetic layer so as to contact with the magnetic layer, and that is formed of a material exhibiting spin orbit coupling; and
a first electrode and a second electrode formed on the electricity-generating layer so as to contact with the electricity-generating layer; and
the first electrode and the second electrode extend in a longitudinal direction of the thermoelectric conversion sheet, and are separated from each other in a first direction perpendicular to the longitudinal direction.

(Supplemental Note 2)

The thermoelectric conversion element according to the supplemental note 1,
wherein the thermoelectric conversion sheet is configured such that electromotive force is generated in the first direction in the electricity-generating layer.

(Supplemental Note 3)

The thermoelectric conversion element according to the supplemental note 2,
wherein magnetization of the magnetic layer includes a component in the longitudinal direction.

(Supplemental Note 4)

The thermoelectric conversion element according to any one of the supplemental notes 1 to 3,
wherein the thermoelectric conversion sheet further includes:
an insulator formed so as to cover the electricity-generating layer, and to occupy a space between the first electrode and the second electrode.

(Supplemental Note 5)

The thermoelectric conversion element according to any one of the supplemental notes 1 to 4,
wherein the thermoelectric conversion sheet is wound around a center axis parallel with the first direction.

(Supplemental Note 6)

The thermoelectric conversion element according to claim 5,
wherein the thermoelectric conversion sheet is wound around a heat source thereon, whose axial direction is the first direction.

(Supplemental Note 7)

A manufacturing method for a thermoelectric conversion element, including:
(A) a step of providing a thermoelectric conversion sheet possessing flexibility,
wherein the thermoelectric conversion sheet includes:
a magnetic layer;
an electricity-generating layer that is formed on the magnetic layer so as to contact with the magnetic layer, and that is formed of a material exhibiting spin orbit coupling; and
a first electrode and a second electrode formed on the electricity-generating layer so as to contact with the electricity-generating layer, and
the first electrode and the second electrode extend in a longitudinal direction of the thermoelectric conversion sheet, and are separated from each other in a first direction perpendicular to the longitudinal direction; and
(B) a step of winding the thermoelectric conversion sheet around a center axis parallel with the first direction.

(Supplemental Note 8)

The manufacturing method for the thermoelectric conversion element according to the supplemental note 7,
wherein the thermoelectric conversion sheet is configured such that electromotive force is generated in the first direction in the electricity-generating layer.

(Supplemental Note 9)

The manufacturing method for the thermoelectric conversion element according to the supplemental note 7 or 8,
wherein the step of winding the thermoelectric conversion sheet includes:
a step of winding the thermoelectric conversion sheet around a support body thereon, whose axial direction is the first direction; and
a step of, after the step of winding the thermoelectric conversion sheet thereon, performing magnetization entirely such that magnetization of the magnetic layer includes a component in the longitudinal direction.

(Supplemental Note 10)

The manufacturing method for the thermoelectric conversion element according to the supplemental note 7 or 8,
wherein the step of winding the thermoelectric conversion sheet includes:
a step of performing magnetization entirely such that magnetization of the magnetic layer includes a component in the longitudinal direction; and
a step of, after the step of performing the magnetization, winding the thermoelectric conversion sheet around a heat source thereon, an axial direction of the heat source being the first direction.

The present application claims the benefit of priority based upon Japanese Patent Application No. 2012-160242 filed on Jul. 19, 2012, the disclosure of which is incorporated herein in its entirety by reference.

The invention claimed is:

1. A thermoelectric conversion element that comprises a flexible thermoelectric conversion sheet,
wherein the thermoelectric conversion sheet comprises:
a magnetic layer;
an electricity-generating layer that is formed on the magnetic layer so as to contact the magnetic layer, and that is formed of a material exhibiting spin orbit coupling; and
a first electrode and a second electrode formed on the electricity-generating layer so as to contact the electricity-generating layer; and
the first electrode and the second electrode extend in a longitudinal direction of the thermoelectric conversion sheet, and are separated from each other in a first direction substantially perpendicular to the longitudinal direction,
wherein a length of the electricity generating layer in the longitudinal direction is greater than a length of the electricity generating layer in the first direction, and
wherein magnetization of the magnetic layer comprises a component in the longitudinal direction.

2. The thermoelectric conversion element according to claim 1,
wherein the thermoelectric conversion sheet is configured such that electromotive force is generated in the first direction in the electricity-generating layer.

3. The thermoelectric conversion element according to claim 1,
wherein the thermoelectric conversion sheet further comprises:
an insulator formed so as to cover the electricity-generating layer, and to occupy a space between the first electrode and the second electrode.

4. The thermoelectric conversion element according to claim 1,
wherein the thermoelectric conversion sheet is wound around a center axis substantially parallel with the first direction.

5. The thermoelectric conversion element according to claim 4,
wherein the thermoelectric conversion sheet is wound around a heat source thereon, whose axial direction is the first direction.

6. The thermoelectric conversion element according to claim 1,
wherein the electricity-generating layer has a meandering-shaped part located between the first electrode and the second electrode.

7. The thermoelectric conversion element according to claim 6,
wherein the meandering-shaped part of the electricity-generating layer has a first efficiency electricity-generating part and a second efficiency electricity-generating part, and wherein electricity generating efficiency of the first efficiency electricity-generating part is higher than that of the second efficiency electricity-generating part.

8. The thermoelectric conversion element according to claim 6,
wherein the meandering-shaped part of the electricity-generating layer includes one or more first efficiency electricity-generating parts and one or more second efficiency electricity-generating parts, the first efficiency electricity-generating parts and the second efficiency electricity-generating parts being arranged alternately in the meandering-shaped part, and the first efficiency being higher than the second efficiency.

9. The thermoelectric conversion element according to claim 8,
wherein the meandering-shaped part of the electricity-generating layer is repeatedly formed in the thermoelectric conversion sheet.

10. The thermoelectric conversion element according to claim 1, wherein a material of the electricity-generating layer is Au, Pt, Pd, or Ir.

11. The thermoelectric conversion element according to claim 1, wherein a material of the electricity-generating layer is an oxide.

12. The thermoelectric conversion element according to claim 1, wherein a material of the magnetic layer is a ferromagnetic metal.

13. The thermoelectric conversion element according to claim 1, wherein the first electrode and the second electrode are formed from the same material as the electricity-generating layer.

14. The thermoelectric conversion element according to claim 1, wherein a first sheet resistance of the first electrode and a second sheet resistance of the second electrode is lower than a sheet resistance of the electricity-generating layer.

15. A thermoelectric conversion element that comprises a flexible thermoelectric conversion sheet,
wherein the thermoelectric conversion sheet comprises:
a magnetic layer;
an electricity-generating layer that is formed on the magnetic layer so as to contact the magnetic layer, and that is formed of a material exhibiting spin orbit coupling; and
a first electrode and a second electrode formed on the electricity-generating layer so as to contact the electricity-generating layer; and
the first electrode and the second electrode extend in a longitudinal direction of the thermoelectric conversion sheet, and are separated from each other in a first direction substantially perpendicular to the longitudinal direction,
wherein a material of the magnetic layer is iron garnet,
wherein a length of the electricity generating layer in the longitudinal direction is greater than a length of the electricity generating layer in the first direction, and
wherein magnetization of the magnetic layer comprises a component in the longitudinal direction.

16. A thermoelectric conversion element that comprises a flexible thermoelectric conversion sheet,
wherein the thermoelectric conversion sheet comprises:
a magnetic layer;
an electricity-generating layer that is formed on the magnetic layer so as to contact the magnetic layer, and that is formed of a material exhibiting spin orbit coupling; and
a first electrode and a second electrode formed on the electricity-generating layer so as to contact the electricity-generating layer; and
the first electrode and the second electrode extend in a longitudinal direction of the thermoelectric conversion sheet, and are separated from each other in a first direction substantially perpendicular to the longitudinal direction,
wherein a material of the magnetic layer is at least one of yttrium iron garnet (YIG, $Y_3Fe_5O_{12}$), bismuth-doped YIG (Bi:YIG), lanthanum-doped YIG ($LaY_2Fe_5O_{12}$), or yttrium gallium iron garnet ($Y_3Fe_{5-x}Ga_xO_{12}$), wherein a length of the electricity generating layer in the longitudinal direction is greater than a length of the electricity generating layer in the first direction, and wherein magnetization of the magnetic layer comprises a component in the longitudinal direction.

\* \* \* \* \*